(12) United States Patent
Na et al.

(10) Patent No.: US 10,431,522 B2
(45) Date of Patent: Oct. 1, 2019

(54) THERMAL INTERFACE MATERIAL LAYER AND PACKAGE-ON-PACKAGE DEVICE INCLUDING THE SAME

(71) Applicant: Samsung Electronics Co., Ltd., Suwon-si, Gyeonggi-do (KR)

(72) Inventors: Min-Ok Na, Bucheon-si (KR); Jongkook Kim, Hwaseong-si (KR); Hyo-Chang Ryu, Cheonan-si (KR); Jin-woo Park, Seoul (KR); BongJin Son, Asan-si (KR); Jangwoo Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 54 days.

(21) Appl. No.: 15/856,800

(22) Filed: Dec. 28, 2017

(65) Prior Publication Data
US 2018/0145006 A1    May 24, 2018

Related U.S. Application Data

(63) Continuation of application No. 14/910,280, filed as application No. PCT/IB2013/056575 on Aug. 12, 2013, now Pat. No. 9,899,294.

(51) Int. Cl.
*H01L 23/373* (2006.01)
*H01L 23/367* (2006.01)
(Continued)

(52) U.S. Cl.
CPC .......... *H01L 23/373* (2013.01); *H01L 21/563* (2013.01); *H01L 23/367* (2013.01);
(Continued)

(58) Field of Classification Search
CPC ........ H01L 23/49816; H01L 2225/107; H01L 2225/1094; H01L 2924/0665;
(Continued)

(56) References Cited

U.S. PATENT DOCUMENTS 5,391,924 A * 2/1995 Uchida ................. H01L 23/293
257/788
7,511,359 B2    3/2009 Tang et al.
(Continued)

FOREIGN PATENT DOCUMENTS

CN    102522380 A    6/2012
CN    103035593 A    4/2013
(Continued)

OTHER PUBLICATIONS

International Search Report PCT/ISA/210 for International Application No. PCT/IB2013/056575 dated May 23, 2014.
(Continued)

*Primary Examiner* — Jasmine J Clark
(74) *Attorney, Agent, or Firm* — Harness, Dickey & Pierce, P.L.C.

(57) ABSTRACT

Provided are a thermal interface material layer and a package-on-package device including the same. The package-on-package device may include a thermal interface material layer interposed between lower and upper semiconductor packages and configured to have a specific physical property. Accordingly, it is possible to prevent a crack from occurring in a lower semiconductor chip, when a solder ball joint process is performed to mount the upper semiconductor package on the lower semiconductor package.

20 Claims, 14 Drawing Sheets

(51) Int. Cl.
  *H01L 21/56* (2006.01)
  *H01L 25/10* (2006.01)
  *H01L 25/00* (2006.01)
  *H01L 25/065* (2006.01)
  *H01L 23/498* (2006.01)
  *H01L 23/50* (2006.01)
  *H01L 23/00* (2006.01)

(52) U.S. Cl.
  CPC .......... *H01L 25/065* (2013.01); *H01L 25/105* (2013.01); *H01L 25/50* (2013.01); *H01L 23/49827* (2013.01); *H01L 23/50* (2013.01); *H01L 24/16* (2013.01); *H01L 24/32* (2013.01); *H01L 24/48* (2013.01); *H01L 24/73* (2013.01); *H01L 24/92* (2013.01); *H01L 25/0657* (2013.01); *H01L 2224/0401* (2013.01); *H01L 2224/04042* (2013.01); *H01L 2224/16225* (2013.01); *H01L 2224/32145* (2013.01); *H01L 2224/32225* (2013.01); *H01L 2224/45015* (2013.01); *H01L 2224/45099* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/92225* (2013.01); *H01L 2225/0651* (2013.01); *H01L 2225/06568* (2013.01); *H01L 2225/107* (2013.01); *H01L 2225/1023* (2013.01); *H01L 2225/1058* (2013.01); *H01L 2225/1094* (2013.01); *H01L 2924/00014* (2013.01); *H01L 2924/15311* (2013.01); *H01L 2924/15331* (2013.01); *H01L 2924/181* (2013.01); *H01L 2924/18161* (2013.01)

(58) Field of Classification Search
  CPC .............. H01L 25/0657; H01L 23/3128; H01L 2225/06568; H01L 2224/04105; H01L 2224/0401; H01L 2224/04042; H01L 2224/48091; H01L 24/16; H01L 2224/32145; H01L 2224/16225; H01L 2224/48227; H01L 2224/32225; H01L 2224/45099; H01L 24/32; H01L 24/48; H01L 24/92; H01L 24/73; H01L 23/50; H01L 23/373; H01L 2924/00014; H01L 2924/207
  USPC .......................................... 257/686; 438/109
  See application file for complete search history.

(56) References Cited

U.S. PATENT DOCUMENTS

| | | | |
|---|---|---|---|
| 8,202,765 | B2 | 6/2012 | Casey et al. |
| 8,421,217 | B2 | 4/2013 | Casey et al. |
| 8,872,321 | B2 | 10/2014 | Zhao et al. |
| 8,928,132 | B2 | 1/2015 | Choi et al. |
| 2002/0018885 | A1 | 2/2002 | Takahashi et al. |
| 2003/0067069 | A1 | 4/2003 | Lebonheur et al. |
| 2005/0228097 | A1 | 10/2005 | Zhong |
| 2007/0152312 | A1 | 7/2007 | Tang et al. |
| 2007/0246823 | A1* | 10/2007 | Haga .................... H01L 21/563 257/712 |
| 2009/0212418 | A1* | 8/2009 | Gurrum ................ H01L 23/293 257/717 |
| 2009/0262503 | A1 | 10/2009 | Kaneko et al. |
| 2010/0181665 | A1 | 7/2010 | Casey et al. |
| 2011/0210436 | A1* | 9/2011 | Chow .................... H01L 21/563 257/686 |
| 2012/0175766 | A1 | 7/2012 | Casey et al. |
| 2012/0182694 | A1 | 7/2012 | Lin et al. |
| 2012/0211885 | A1 | 8/2012 | Choi et al. |
| 2012/0299173 | A1 | 11/2012 | Mohammed et al. |
| 2013/0082372 | A1 | 4/2013 | Lin et al. |
| 2013/0093073 | A1 | 4/2013 | Chen et al. |
| 2014/0097533 | A1 | 4/2014 | Liu et al. |

FOREIGN PATENT DOCUMENTS

| | | |
|---|---|---|
| CN | 103050454 A | 4/2013 |
| CN | 103050455 A | 4/2013 |
| KR | 1020120094712 | 8/2012 |
| TW | 200635992 A | 10/2006 |

OTHER PUBLICATIONS

Chinese Examination Report dated Nov. 30, 2017 for corresponding Chinese Patent Application No. 201380078824.4.

\* cited by examiner

THERMAL INTERFACE MATERIAL LAYER AND PACKAGE-ON-PACKAGE DEVICE INCLUDING THE SAME

CROSS-REFERENCE TO RELATED APPLICATIONS

This application is a continuation of U.S. application Ser. No. 14/910,280, filed on Feb. 5, 2016, which is a national phase under 35 U.S.C. § 371 of PCT International Application No. PCT/IB2013/056575 filed on Aug. 12, 2013, the entire contents of each of which are hereby incorporated by reference.

TECHNICAL FIELD

Example embodiments of the inventive concept relate to a thermal interface material layer and a package-on-package device including the same.

BACKGROUND ART

High-performance, high-speed and compact electronic systems are seeing increasing demand as the electronic industry matures. Various semiconductor package techniques have been proposed to meet such a demand. For example, a semiconductor package device may be configured to include a plurality of semiconductor chips mounted on a package substrate or to have a package-on-package (PoP) structure. Since each package of the PoP device has a semiconductor chip and a package substrate, the PoP device has a large thickness causing various technical problems. In addition, for the PoP device, it is difficult to exhaust heat generated in semiconductor chips to the outside, and thus, the PoP device suffers from technical problems, such as a device malfunction or a reduction in operation speed.

DISCLOSURE

Technical Problem

Example embodiments of the inventive concept provide a thermal interface material layer preventing a crack problem from occurring in a lower semiconductor chip, which may be included in a lower semiconductor package of a package-on-package device.

Other example embodiments of the inventive concept provide a package-on-package device including the thermal interface material layer.

Technical Solution

According to example embodiments of the inventive concept, a thermal interface material layer may be interposed between a lower semiconductor package and an upper semiconductor package, wherein the thermal interface material layer has modulus of elasticity of 500 kPa or less.

In example embodiments, the thermal interface material layer has Mohs hardness that is lower than 7. The thermal interface material layer has thermal conductivity of 1 W/mK or higher.

In example embodiments, the thermal interface material layer may include a resin layer and filler particles distributed in the resin layer, and the resin layer has modulus of elasticity of 500 kPa or less. The resin layer may be formed of a silicon-based compound or a rubber-based compound.

In example embodiments, the filler particles have Mohs hardness that is lower than 7.

In example embodiments, the filler particles may be configured to exhibit an insulation property.

In example embodiments, the filler particles may be at least one of boron nitride particles and zinc oxide particles.

In other embodiments, at least one of the filler particles may include a metal particle coated with an insulating layer, and the metal particle has Mohs hardness that is lower than 7. For example, at least one of the filler particles may be aluminum particle coated with aluminum oxide.

In example embodiments, a content of the filler particles in the thermal interface material layer ranges from 60 wt % to 95 wt %.

According to other example embodiments of the inventive concept, a thermal interface material layer may be interposed between a lower semiconductor package and an upper semiconductor package stacked sequentially and be configured to have Mohs hardness that is lower than 7.

According to still other example embodiments of the inventive concept, a package-on-package device may include a lower semiconductor package including a lower package substrate and a lower semiconductor chip mounted on the lower package substrate, an upper semiconductor package including an upper package substrate provided on the lower semiconductor package and an upper semiconductor chip mounted on the upper package substrate, and a first thermal interface material layer interposed between the lower semiconductor chip and the upper package substrate. Here, the first thermal interface material layer has modulus of elasticity of 500 kPa or less.

In example embodiments, the first thermal interface material layer has Mohs hardness that may be lower than that of the lower semiconductor chip.

In example embodiments, the first thermal interface material layer may be in contact with a top surface of the lower semiconductor chip. In other embodiments, the lower semiconductor package may further include a lower mold layer covering a top surface of the lower semiconductor chip, and the first thermal interface material layer may be in contact with a top surface of the lower mold layer.

In example embodiments, the device may further include an interposer substrate interposed between the lower semiconductor package and the upper semiconductor package. Here, the first thermal interface material layer may be interposed between the lower semiconductor package and the interposer substrate and between the upper semiconductor package and the interposer substrate.

In example embodiments, the device may further include a second thermal interface material layer disposed on the upper semiconductor package, and a heat-dissipating plate disposed on the second thermal interface material layer. Here, the second thermal interface material layer has a different physical property from that of the first thermal interface material layer.

According to even other example embodiments of the inventive concept, a package-on-package device may include a lower semiconductor package including a lower package substrate and a lower semiconductor chip mounted on the lower package substrate, an upper semiconductor package including an upper package substrate provided on the lower semiconductor package and an upper semiconductor chip mounted on the upper package substrate, and a first thermal interface material layer interposed between the lower semiconductor chip and the upper package substrate. The first thermal interface material layer has Mohs hardness that is lower than 7.

Advantageous Effects

According to example embodiments of the inventive concept, a thermal interface material layer may be interposed between lower and upper semiconductor packages of a package-on-package device and be configured to have a specific physical property (for example, Mohs hardness lower than 7 and/or modulus of elasticity of 500 kPa or less). Accordingly, it is possible to prevent a crack from occurring in a lower semiconductor chip, when a solder ball joint process is performed to mount the upper semiconductor package on the lower semiconductor package. As a result, it is possible to reduce a failure of the package-on-package device and to improve a yield of the package-on-package device.

In addition, since the thermal interface material layer is added between the lower and upper semiconductor packages, it is possible to exhaust heat generated in the lower semiconductor chip quickly to the upper semiconductor package. As a result, it is possible to reduce a malfunction of the package-on-package device and to increase an operation speed of the package-on-package device.

DESCRIPTION OF DRAWINGS

Example embodiments will be more clearly understood from the following brief description taken in conjunction with the accompanying drawings. The accompanying drawings represent non-limiting, example embodiments as described herein.

Figure 1:
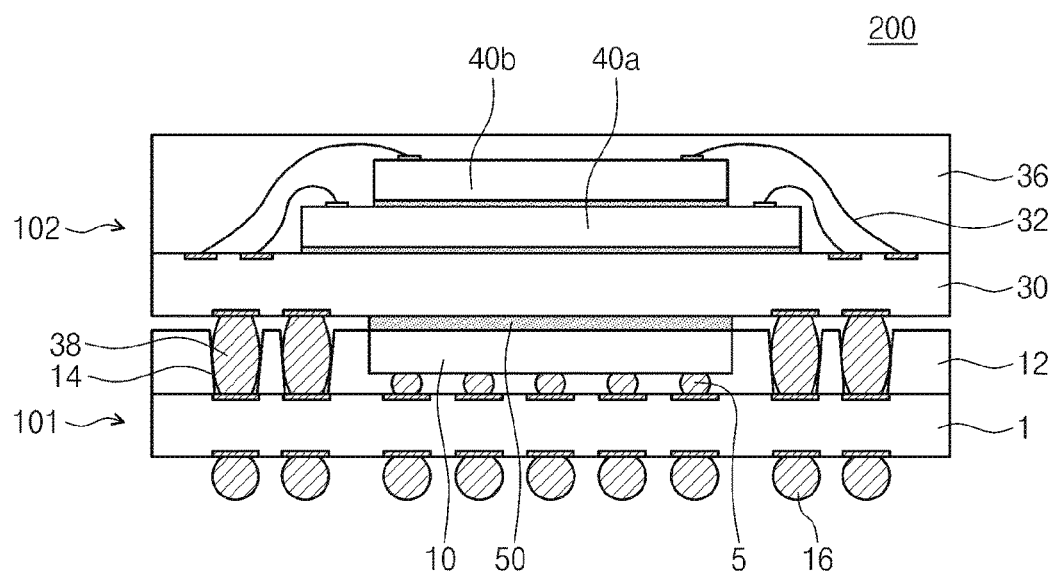
FIG. 1 is a sectional view illustrating an example of package-on-package devices according to example embodiment 1 of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

MODE FOR INVENTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiment 1

Figure 2:
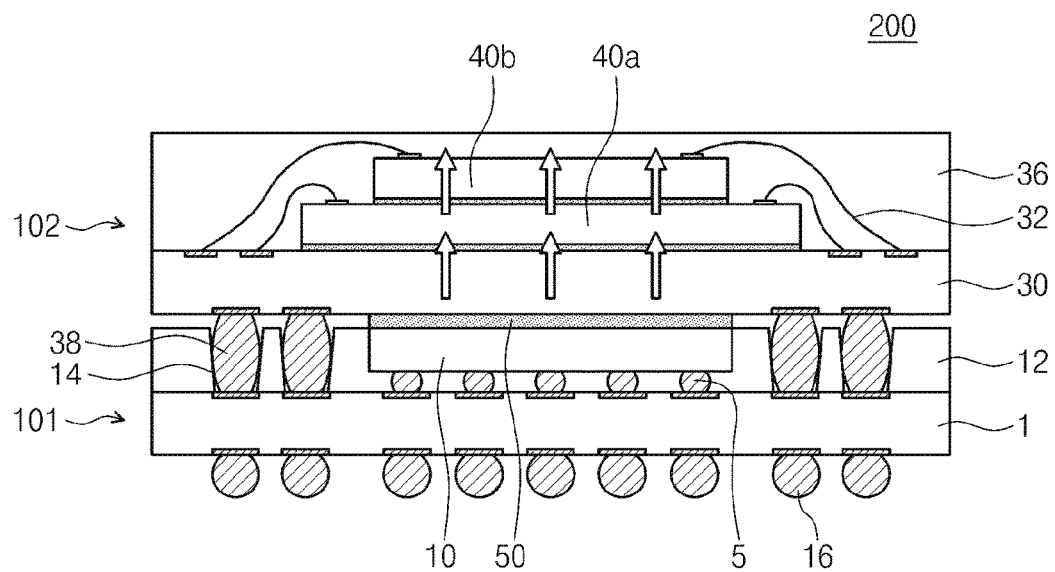
FIG. 2 is a diagram Illustrating a heat transfer process in a package-on-package device of FIG. 1.
Figure 3A:
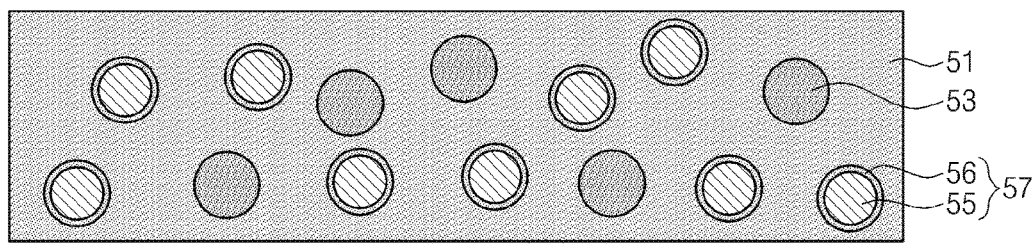
FIGS. 3A through 3C are sectional views exemplarily illustrating thermal interface material layers according to example embodiments of the inventive concept.
Figure 3B:
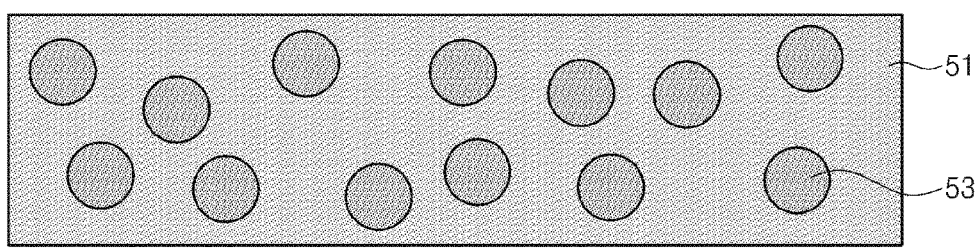
Figure 3C:
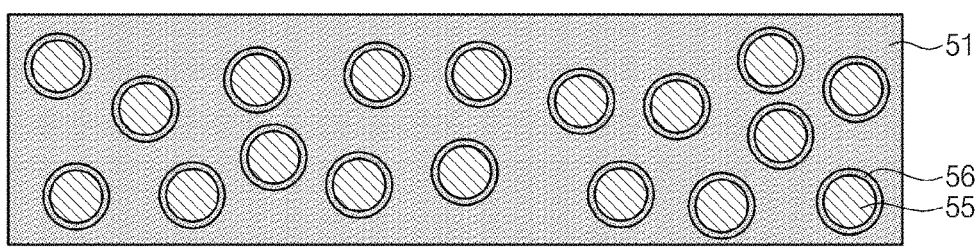

FIG. 1 is a sectional view illustrating an example of package-on-package devices according to example embodiment 1 of the inventive concept. FIG. 2 is a diagram illustrating a heat transfer process in a package-on-package device of FIG. 1. FIGS. 3A through 3C are sectional views exemplarily illustrating thermal interface material layers according to example embodiments of the inventive concept.

Referring to FIG. 1, a package-on-package device 200 according to the present embodiment 1 may include a lower semiconductor package 101 and an upper semiconductor package 102.

The lower semiconductor package 101 may include a lower package substrate 1, a lower semiconductor chip 10 mounted on the lower package substrate 1, and a lower mold layer 12 covering them. The lower semiconductor chip 10 may be electrically connected to the lower package substrate 1 in a flip-chip bonding manner using first lower solder bumps 5. Second lower solder bumps 16 may be provided under the lower package substrate 1. The lower mold layer 12 may cover a sidewall of the lower semiconductor chip 10 and expose a top surface of the lower semiconductor chip 10. In other words, the top surface of the lower semiconductor chip 10 may not be covered with the lower mold layer 12. The lower mold layer 12 may be provided to have connection holes 14 formed spaced apart from the lower semiconductor chip 10. The lower semiconductor chip 10 may be, for example, a logic chip. The lower semiconductor chip 10 may include a variety of electronic devices, such as a central processor unit (CPU), a graphic processor unit (GPU), and/or a universal serial bus (USB).

The upper semiconductor package 102 may include an upper package substrate 30, upper semiconductor chips 40a and 40b mounted on the upper package substrate 30, and an upper mold layer 36 covering them. The upper semiconductor chips 40a and 40b may include a first upper semiconductor chip 40a and a second upper semiconductor chip 40b. The upper semiconductor chips 40a and 40b may be mounted on the upper package substrate 30 in a wire bonding manner. The upper semiconductor chips 40a and 40b may be, for example, memory chips.

The upper semiconductor package 102 may be stacked on the lower semiconductor package 101. In example embodiments, the lower and upper semiconductor packages 101 and 102 may be electrically connected to each other through connection solder bumps 38. The connection solder bumps 38 may be provided in the connection holes 14, respectively.

A thermal interface material layer 50 may be interposed between the lower semiconductor chip 10 and the upper package substrate 30. The thermal interface material layer 50 may be in contact with both of a top surface of the lower semiconductor chip 10 and a bottom surface of the upper package substrate 30.

In the package-on-package device 200, the thermal interface material layer 50 may be interposed between the lower semiconductor chip 10, which may be a logic chip or a main source of heat, and the upper package substrate 30. If the lower semiconductor chip 10 is spaced apart from the upper package substrate 30 without the thermal interface material layer 50, a space therebetween may be filled with air. Since a gaseous material, such as air, has a thermal conductivity that is significantly lower than a solid material, there may be a difficulty in dissipating or exhausting heat that is generated from the lower semiconductor chip 10, when the thermal interface material layer 50 is not provided. By contrast, according to example embodiments of the inventive concept, it is possible to transfer effectively heat generated from the lower semiconductor chip 10 to the upper semiconductor package 102 through the thermal interface material layer 50 (as depicted by arrows of FIG. 2) and thereby exhaust heat to the outside. This makes it possible to improve an operation speed of the device and reduce a problem of malfunction. Further, this makes it possible to defer a starting time of dynamic thermal management (DTM) and thereby improve a usage efficiency of the central processing unit.

In the meantime, when the upper semiconductor package 102 is mounted on the lower semiconductor package 101, a pressure from the upper semiconductor package 102 may be exerted to the lower semiconductor package 101. Here, if the thermal interface material layer 50 is provided therebetween, the lower semiconductor chip 10 may suffer from a higher impact, compared with the case of the absence of the thermal interface material layer 50. As a result, the lower semiconductor chip 10 may be cracked. To avoid such a crack problem, the thermal interface material layer 50 may be configured to have a special physical property.

For example, the thermal interface material layer 50 may have a modulus of elasticity of 500 kPa or less. Due to the low modulus of elasticity of 500 kPa or less, the thermal interface material layer 50 may be softer and absorb more effectively an impact, when compared with the case that a material with high modulus of elasticity is used for the thermal interface material layer 50. Accordingly, it is possible to prevent the crack problem from occurring in the lower semiconductor chip 10, when the upper semiconductor package 102 is mounted on the lower semiconductor package 101.

The thermal interface material layer 50 may have a Mohs hardness that is lower than that of the lower semiconductor chip 10. For example, the thermal interface material layer 50 may have a Mohs hardness that is lower than 7. Due to the low Mohs hardness that is lower than 7, the thermal interface material layer 50 may be softer and absorb more effectively an impact, when compared with the case that a material with Mohs hardness higher than 7 is used for the thermal interface material layer. Accordingly, it is possible to prevent the crack problem from occurring in the lower semiconductor chip 10, when the upper semiconductor package 102 is mounted on the lower semiconductor package 101.

The thermal interface material layer 50 may have a thermal conductivity of 1 W/mK or higher. This makes it possible to exhaust heat generated in the lower semiconductor chip 10 quickly to the upper semiconductor package 102. As a result, in the central processor unit of the lower semiconductor chip 10, it is possible to reduce problems of frequency loss and malfunction and to improve an operation speed.

The thermal interface material layer 50 may be formed of an insulating material. Accordingly, even when the thermal interface material layer 50 is in contact with the connection solder bumps 38 disposed adjacent thereto, it is possible to prevent electric short from occurring between the connection solder bumps 38.

In example embodiments, as shown in FIG. 3A, the thermal interface material layer 50 may include a resin layer 51 and filler particles 53 and 57 distributed in the resin layer 51. The thermal interface material layer 50 may have a modulus of elasticity that is strongly dependent on that of the resin layer 51. For example, the modulus of elasticity of the thermal interface material layer 50 may be substantially equivalent to that of the resin layer 51. The thermal interface material layer 50 may have a Mohs hardness that is strongly dependent on that of the resin layer 51. For example, the Mohs hardness of the thermal interface material layer 50 may be substantially equivalent to that of the resin layer 51.

The resin layer 51 may have a modulus of elasticity of 500 kPa or less. The resin layer 51 may be or include a silicon-based compound or a rubber-based compound. The modulus of elasticity of the resin layer 51 may vary depending on composition and content of constituents therein. According to example embodiments of the inventive concept, the thermal interface material layer 50 may include a silicon-based or rubber-based resin layer having a modulus of elasticity of 500 kPa or less.

The filler particles 53 and 57 may have a Mohs hardness that is lower than that of the lower semiconductor chip 10. For example, the filler particles 53 and 57 may have a Mohs hardness that is lower than 7. The filler particles 53 and 57 may be formed of an insulating material. The filler particles 53 and 57 may include first filler particles 53 and second filler particles 57. The first filler particles 53 may be made of boron nitride with Mohs hardness of about 2 and/or zinc oxide with Mohs hardness of about 4-5. Each of the second filler particles 57 may include a metal particle 55 and an insulating layer 56 covering the metal particle 55. Here, the metal particle 55 may have a Mohs hardness that is lower than 7. The insulating layer 56 may have a thickness of several tens to several hundreds nanometers. The metal particle 55 may have a diameter of about several to several hundreds micrometers. In example embodiments, the insulating layer 56 may be made of aluminum oxide, and the metal particle 55 may be made of aluminum. The insulating layer 56 may allow the second filler particles 57 to exhibit an insulating property. Since the insulating layer 56 has a thickness that is relatively much smaller than a diameter of the metal particle 55, the Mohs hardness of the second filler particles 57 may not be substantially affected by the presence of the insulating layer 56. In other words, the second filler particles 57 can have the Mohs hardness that is substantially equivalent to that of the metal particle 55. In example embodiments, the metal particle 55 may have a Mohs hardness of about 3.

As described above, in the case where the filler particles 53 and 57 have a Mohs hardness that is lower than 7 and the resin layer 50 has a modulus of elasticity of 500 kPa or less, it is possible to realize the thermal interface material layer 50 with Mohs hardness that is lower than 7 and with modulus of elasticity of 500 kPa or less.

In example embodiments, the filler particles 53 and 57 may be provided to have about 60-95 wt % in the thermal interface material layer 50. As a result, the thermal interface material layer 50 may be configured to have a thermal conductivity of 1 W/mK or more.

FIG. 3A shows the resin layer 51 including the first filler particles 53 and the second filler particles 57. But example embodiments of the inventive concept may not be limited thereto. For example, as shown in FIG. 3B, only the first filler particles 53 may be distributed in the resin layer 51, or as shown in FIG. 3C, only the second filler particles 57 may be distributed in the resin layer 51.

FIGS. 4 through 7 are sectional views illustrating a process of fabricating the package-on-package device of FIG. 1.

Figure 4:
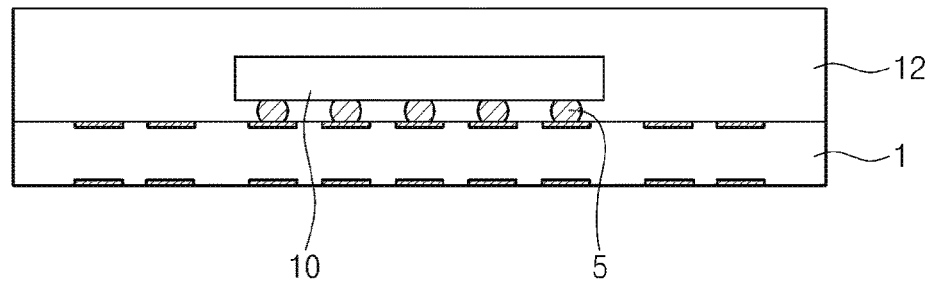
FIGS. 4 through 7 are sectional views illustrating a process of fabricating the package-on-package device of FIG. 1.

Referring to FIG. 4, the lower semiconductor chip 10 may be mounted on the lower package substrate 1 in a flip-chip bonding manner using the first lower solder bumps 5. Next, a molding process may be performed to form the lower mold layer 12 covering the lower semiconductor chip 10.

Figure 5:
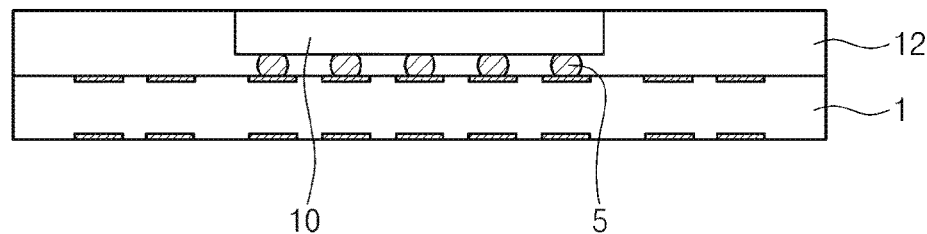

Referring to FIG. 5, a polishing process may be performed to remove at least partially an upper portion of the lower mold layer 12 and thereby expose the top surface of the lower semiconductor chip 10. In example embodiments, a top portion of the lower semiconductor chip 10 may be partially removed during the polishing process, and thus, the lower semiconductor chip 10 may be formed to have a desired thickness.

Alternatively, without the addition of the polishing process, the molding process may be performed in such a way that the top surface of the lower semiconductor chip 10 is exposed by the lower mold layer 12.

Figure 6:
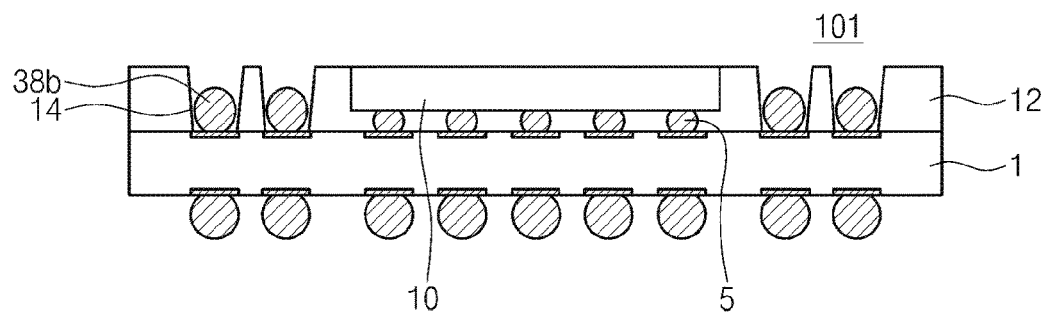

Referring to FIG. 6, the second lower solder bumps 16 may be attached on the bottom surface of the lower package substrate 1. The connection holes 14 may be formed in the lower mold layer 12 using for example laser. Next, lower connection solder bumps 38b may be formed on portions of the lower package substrate 1 exposed by the connection holes 14. Accordingly, the lower semiconductor package 101 may be formed.

Figure 7:
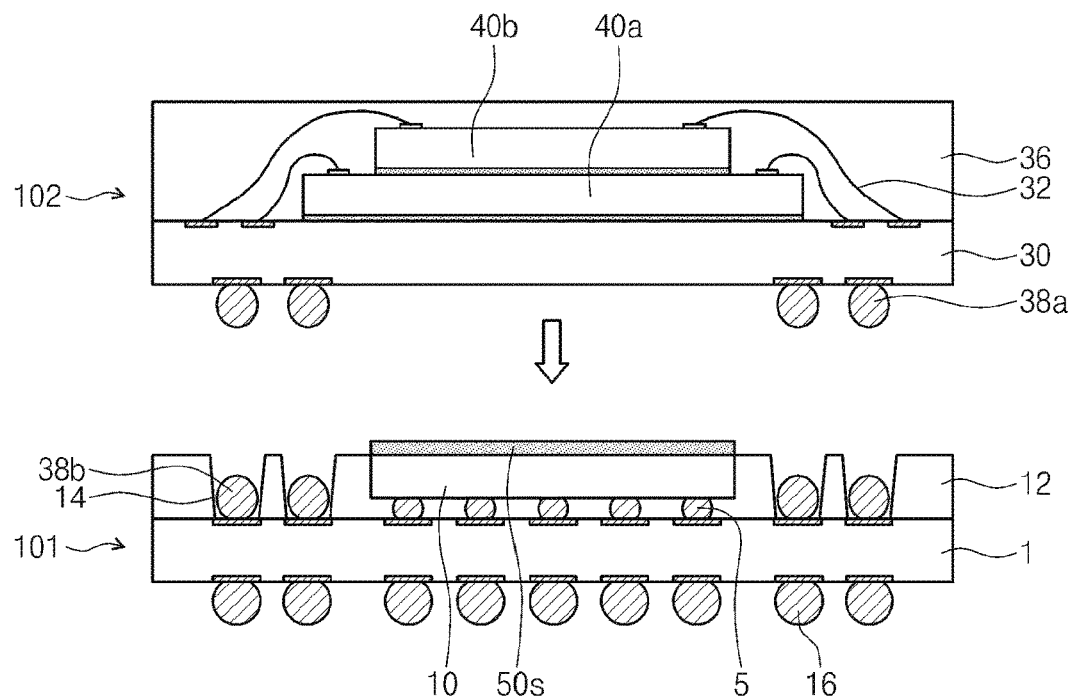

Referring to FIG. 7, the first upper semiconductor chip 40a and the second upper semiconductor package 40b may be sequentially stacked on the upper package substrate 30 and be electrically connected to the upper package substrate 30 using wires 32. A molding process may be performed to form the upper mold layer 36 covering the upper semiconductor chips 40a and 40b. Upper connection solder bumps 38a may be attached on a bottom surface of the upper package substrate 30.

Next, the top surface of the lower semiconductor chip 10 may be coated with a thermal interface material composition 50s. The thermal interface material composition 50s may be provided to include a resin solution, in which the filler particles 53 and 57 described with reference to FIGS. 3A through 3C are distributed. The upper semiconductor package 102 may be disposed on the lower semiconductor chip 10. Then, the upper connection solder bumps 38a may be inserted into the connection holes 14, respectively. The resulting structure may be heated up to a melting point of the connection solder bumps 38a and 38b, and thus, the upper and lower connection solder bumps 38a and 38b may be welded to each other. In this process, solvent in the thermal interface material composition 50s may be volatilized, and as a result, the thermal interface material layer 50 of FIG. 1 may be formed.

During the above process, a pressure from the upper semiconductor package 102 may be exerted to the lower semiconductor chip 10. If the modulus of elasticity and Mohs hardness of the thermal interface material layer 50 are not in appropriate ranges as mentioned above, the lower semiconductor chip 10 may be cracked or broken. By contrast, according to example embodiments of the inventive concept, since the thermal interface material layer 50 has the modulus of elasticity of 500 kPa or less and/or the Mohs hardness that is lower than 7, the lower semiconductor chip 10 can be prevented from being cracked or broken.

Subsequently, the package-on-package device 200 may be cooled. Next, a test process may be performed to examine whether there is a failure in the package-on-package device 200. During this test process, the package-on-package device 200 may be pushed down by a test socket. Here, if the modulus of elasticity and Mohs hardness of the thermal interface material layer 50 are not in appropriate ranges, the lower semiconductor chip 10 may be cracked or broken. By contrast, according to example embodiments of the inventive concept, since the thermal interface material layer 50 has the modulus of elasticity of 500 kPa or less and/or the Mohs hardness that is lower than 7, the lower semiconductor chip 10 can be prevented from being cracked or broken.

Experimental examples of the inventive concept will be described below.

First Experimental Example

In the first experimental example, a thermal interface material layer 165 was tested to know what relationship exists between insulation, crack, and scratch properties thereof and the type of filler particles contained therein. In the first experimental example, aluminum particle coated with aluminum oxide ($Al_2O_3$-coated Al), zinc oxide (ZnO), aluminum oxide ($Al_2O_3$), silicon oxide ($SiO_2$), and silver (Ag) were used as the filler particle. A silicon-based material was used in common for the resin layer.

(1) Insulation Property of a Thermal Interface Material Layer

Figure 8:
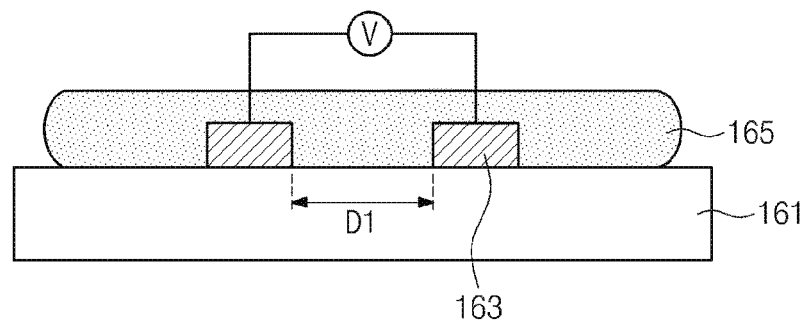
FIG. 8 is a schematic diagram illustrating a circuit configuration for a first experimental example, in which insulation properties of thermal interface material layers according to example embodiments of the inventive concept are tested.

FIG. 8 is a schematic diagram illustrating a circuit configuration for a first experimental example, in which insulation properties of thermal interface material layers according to example embodiments of the inventive concept are tested.

Referring to FIG. 8, conductive patterns 163 were formed on a substrate 161 to be spaced apart from each other. A space D1 between the conductive patterns 163 was 80 μm. The conductive patterns 163 were covered with the thermal interface material layer 165. A voltage of 45V was applied between the conductive patterns 163 at a temperature of 85° C. and humidity of 85%. Then, electrical resistance was measured as a function of time, between the conductive patterns 163. Whenever the type of the filler particles in the thermal interface material layer 165 was changed, the above process was repeated.

In the case that $Al_2O_3$-coated Al particles were used as the filler particles, the measured electrical resistance was illustrated in Table 1.

TABLE 1

| | Elapse Time (hour) | | |
|---|---|---|---|
| | 0 | 150 | 300 |
| electrical resistance (Ω) | $4 \times 10^9$ | $3 \times 10^{10}$ | $4 \times 10^{10}$ |

As shown in Table 1, the extremely high electrical resistance of about $10^{10} \Omega$ was maintained, even after 300 hours elapsed. That is, the conductive patterns 163 were electrically separated from each other. As a result, it can be said that if $Al_2O_3$-coated Al particles are used as the filler particles, the thermal interface material layer 165 can exhibit a good insulating property.

(2) Crack Property of a Semiconductor Chip

Figure 9A:
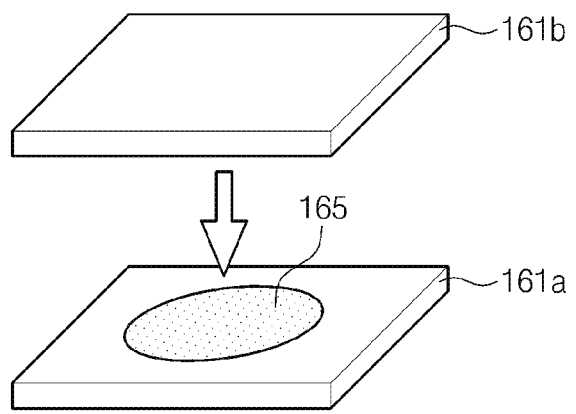
FIGS. 9A through 9C are perspective views schematically illustrating a test process, which is performed to examine whether a crack is formed in a semiconductor chip, as a part of the first experimental example of the inventive concept.
Figure 9B:
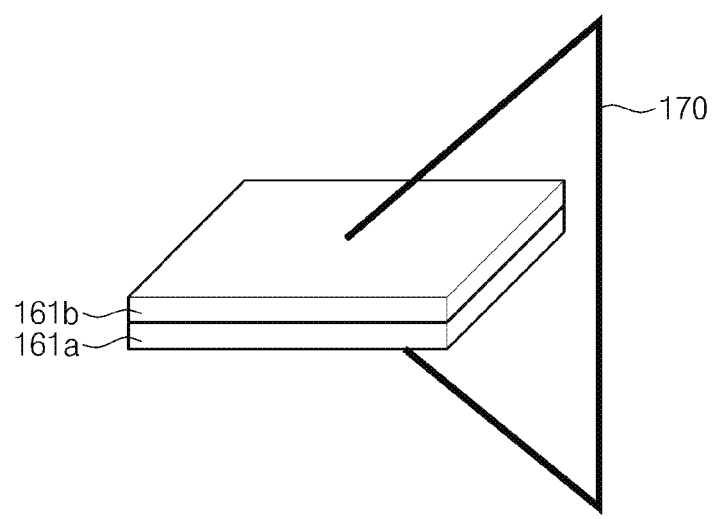
Figure 9C:
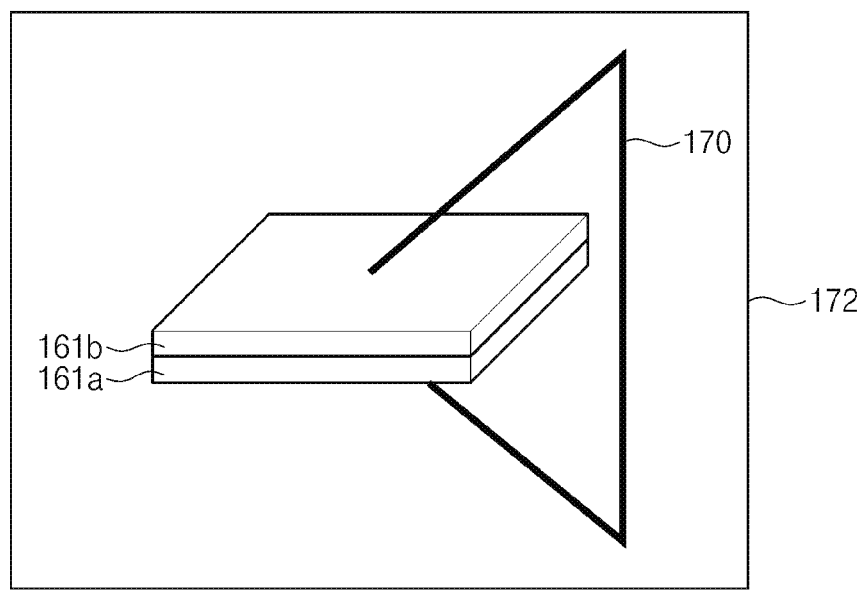

FIGS. 9A through 9C are perspective views schematically illustrating a test process, which is performed to examine whether a crack is formed in a semiconductor chip, as a part of the first experimental example of the inventive concept.

Referring to FIG. 9A, the thermal interface material layer 165 was interposed between semiconductor chips 161a and 161b, each of which was prepared to have an area of about 10 mm×10 mm. As shown in FIG. 9B, a clip 170 was used to exert a pressure of 200 psi to the resulting structure at the room temperature for 10 minutes, and as a result, a thickness of the thermal interface material layer 165 between the semiconductor chips 161a and 161b was reduced to about 20 μm. As shown in FIG. 9C, the resulting structure was loaded in an oven 172, and then, a curing process was performed the resulting structure, for about 120 minutes at a temperature of 150° C. Thereafter, the semiconductor chips 161a and 161b were unloaded and inspected.

(3) Scratch Property of a Semiconductor Chip

Figure 10:
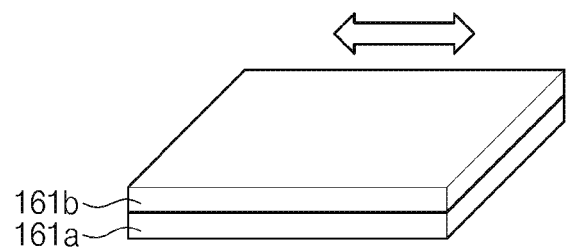
FIG. 10 is a perspective view schematically illustrating a test process, which is performed to examine whether a scratch is produced or not in a semiconductor chip, as a part of the first experimental example of the inventive concept.

FIG. 10 is a perspective view schematically illustrating a test process, which is performed to examine whether a scratch is produced or not in a semiconductor chip, as a part of the first experimental example of the inventive concept.

Referring to FIG. 10, the thermal interface material layer 165 was disposed between the semiconductor chips 161a and 161b, as shown in FIG. 9A, and then, the upper one (e.g., 161b) of the semiconductor chips was moved twenty times from side to side. Thereafter, the semiconductor chips 161a and 161b were separated to inspect visually surfaces thereof that were in contact with the thermal interface material layer 165.

The result obtained from the three test processes is summarized in the following table 2.

TABLE 2

| Filler Type | Al$_2$O$_3$-coated Al | ZnO | Al$_2$O$_3$ | SiO$_2$ | BN | Ag |
|---|---|---|---|---|---|---|
| Mohs hardness | 3-5 | 3-5 | 9 | 7 | 2 | 2.4 |
| Insulation | Good | Good | Good | Good | Good | Bad |
| Crack | None | None | Occurrence | Occurrence | None | None |
| Scratch | None | None | Occurrence | Occurrence | None | None |

As shown in Table 2, in the case that the thermal interface material layer was configured to include filler particles with Mohs hardness that is lower than 7, a crack of a semiconductor chip or a surface scratch did not occur. However, silver (Ag) had a good Mohs hardness property (i.e., 2.4), but it was not coated with an insulating layer, thereby exhibiting a bad insulation property. In other words, silver is unsuitable for the filler particles of the thermal interface material layer. According to Table 2, it can be said that Mohs hardness that is lower than 7 and insulation property are required for the filler particles. Further, given that the Mohs hardness of the thermal interface material layer is strongly dependent on that of the filler particle, it can be said that Mohs hardness that is lower than 7 is required for the thermal interface material layer.

Second Experimental Example

In the second experimental example, a relationship between a modulus of elasticity of the thermal interface material layer interposed between the lower and upper semiconductor packages and a yield of a package-on-package device was examined. In the second experimental example, the package-on-package devices 200 of FIG. 1 were formed by performing process steps described with reference to FIGS. 4 through 7. As shown in the following table 3, the package-on-package devices 200 were configured to include the thermal interface material layers having a modulus of elasticity ranging from 50 kPa to 120 MPa and then, yield thereof was examined. A change in modulus of elasticity of the thermal interface material layer was achieved by changing constituent, composition, and/or content of a resin layer of the thermal interface material layer. In the following table 3, a yield of 100% means there is no problem related to crack of the lower semiconductor chip, and a yield of 0% means that a ratio of a failed device is 100%.

TABLE 3

| | Modulus of elasticity | | | | | | | | | | |
|---|---|---|---|---|---|---|---|---|---|---|---|
| | 50 kPa | 100 kPa | 200 kPa | 300 kPa | 400 kPa | 500 kPa | 600 kPa | 700 kPa | 800 kPa | 1 MPa | 120 MPa |
| Yield (%) | 100 | 100 | 100 | 100 | 100 | 100 | 98 | 52 | 14 | 2 | 0 |

As shown in Table 3, when the thermal interface material layer had a modulus of elasticity of 500 kPa or less, the yield was 100%. This shows that the thermal interface material layer between the lower and upper semiconductor packages should have a modulus of elasticity of 500 kPa or less.

Third Experimental Example

In the third experimental example, a package-on-package device was examined to know what relationship exists between a thermal-resistance reduction ratio thereof and a thermal conductivity of the thermal interface material layer between the lower and upper semiconductor packages. The result was summarized in the following table 4. A change in thermal conductivity of the thermal interface material layer was achieved by changing content of the filler particles contained in the thermal interface material layer. Temperatures of the package-on-package device were measured at various locations and calculating to calculate the thermal-resistance reduction ratio. A high thermal-resistance reduction ratio means that the thermal resistance of the package-on-package device can be easily reduced and thereby, heat can be effectively exhausted.

TABLE 4

| Thermal conductivity [W/mK] | 0.01 | 0.3 | 1 | 2 | 3 | 5 |
|---|---|---|---|---|---|---|
| Thermal resistance reduction ratio [%] | 0 | 7.6 | 9.7 | 10.6 | 11 | 11.4 |

Figure 11:
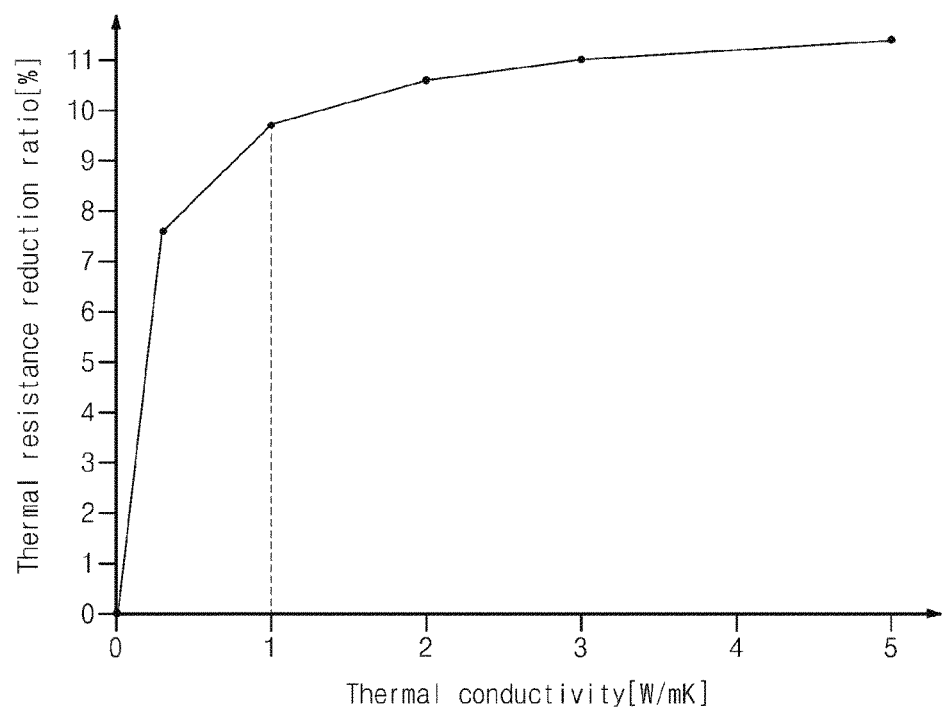
FIG. 11 is a graph showing a result of a third experimental example.

The result of Table 4 is shown in a graph of FIG. 11.

According to the graph of FIG. 11, in the case of thermal conductivity of 1 W/mK or higher, a change in thermal resistance reduction ratio was reduced and saturated to have a value of about 10. In other words, in the case where the thermal interface material layer between the lower and upper semiconductor packages has a thermal conductivity of 1 W/mK or higher, it has substantially the same thermal resistance reduction ratio. According to this result, it is preferred for the thermal interface material layer to have a thermal conductivity of 1 W/mK or more.

The experimental examples show that it is preferred for the thermal interface material layer, which may be interposed between the lower and upper semiconductor packages, to have the physical properties or values described above.

Embodiment 2

Figure 12:
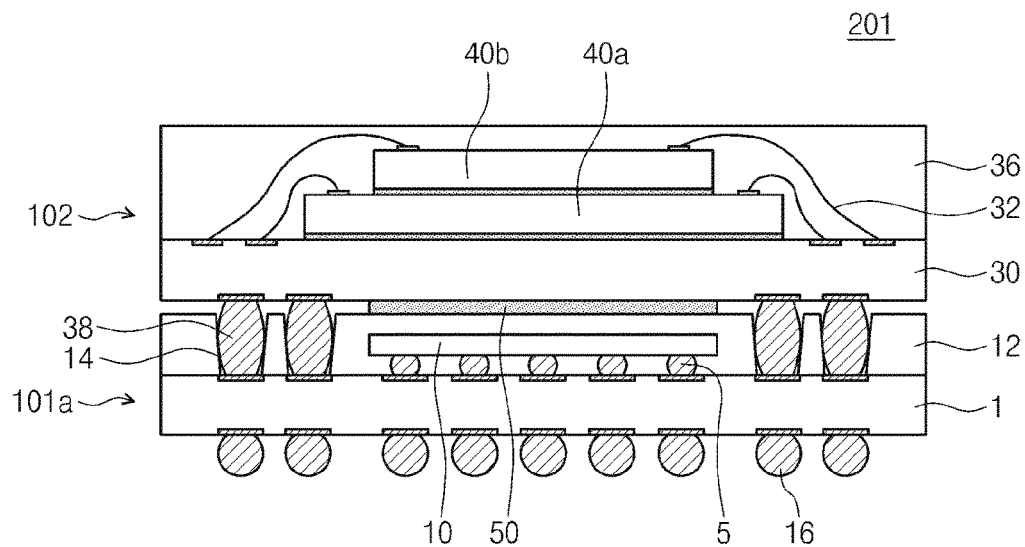
FIG. 12 is a sectional view illustrating an example of package-on-package devices according to example embodiment 2 of the inventive concept.

FIG. 12 is a sectional view illustrating an example of package-on-package package devices according to example embodiment 2 of the inventive concept.

Referring to FIG. 12, according to the present embodiment, in a lower semiconductor package 101a of a package-on-package device 201, the top surface of the lower semiconductor chip 10 may be covered with the lower mold layer 12. The thermal interface material layer 50 may be spaced apart from the lower semiconductor chip 10 and be in contact with both of the top surface of the lower mold layer 12 and the bottom surface of the upper package substrate 20. Although the thermal interface material layer 50 is spaced apart from the lower semiconductor chip 10, a distance between them may be too small to allow the thermal interface material layer 50 to have substantially the same physical property as those described with reference to the example embodiments. Accordingly, it is possible to prevent the lower semiconductor chip 10 from being damaged or cracked.

Except for this difference, the package-on-package device 201 and its fabricating method may be configured to have substantially the same or similar features as those of the example embodiments of the inventive concept.

Embodiment 3

Figure 13:
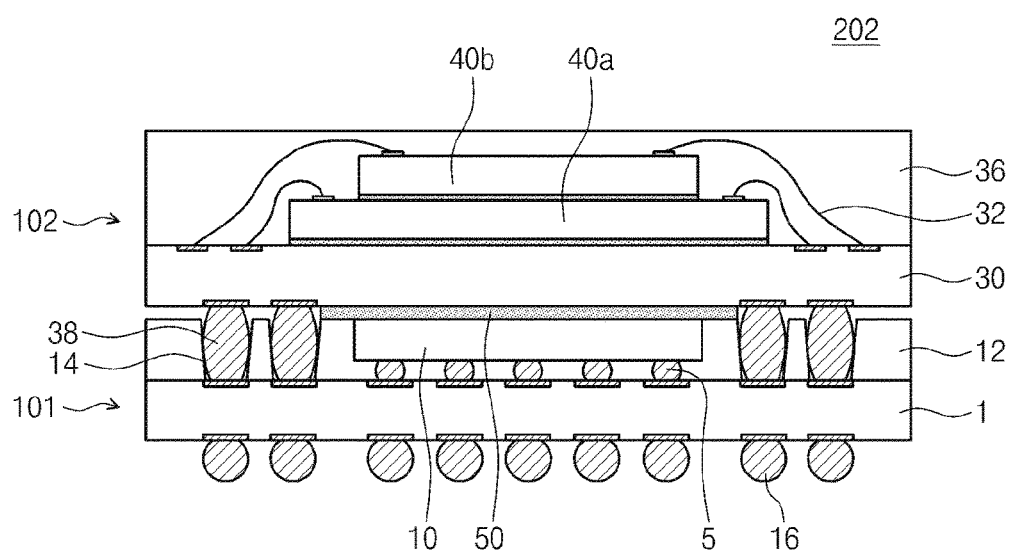
FIGS. 13 and 14 are sectional views illustrating examples of package-on-package devices according to example embodiment 3 of the inventive concept.
Figure 14:
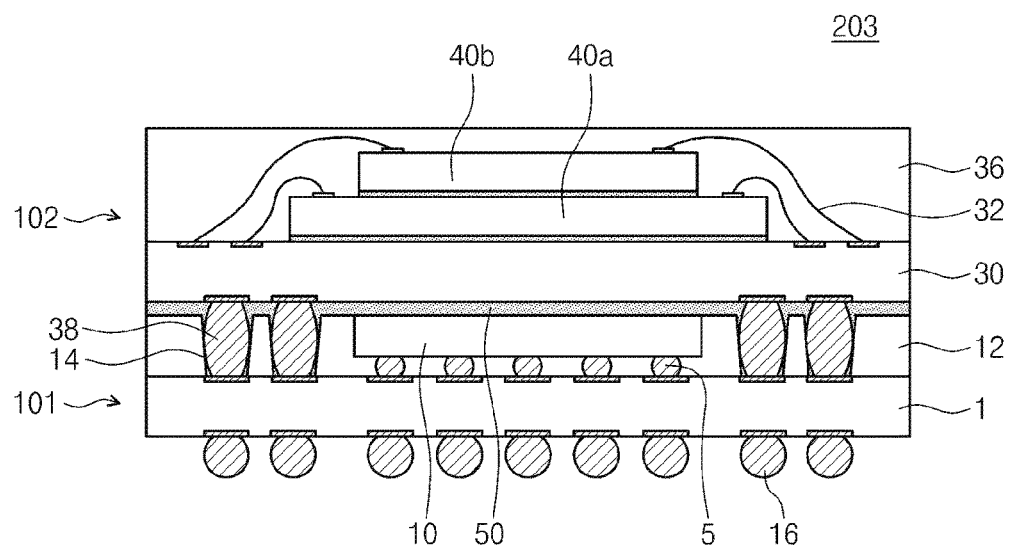

FIGS. 13 and 14 are sectional views illustrating examples of package-on-package devices according to embodiment 3 of the inventive concept.

Referring to FIG. 13, according to the present embodiment, a package-on-package device 202 may include the thermal interface material layer 50 that extends laterally to be in contact with the top surfaces of both of the lower semiconductor chip 10 and the lower mold layer 12.

Referring to FIG. 14, according to the present embodiment, a package-on-package device 203 may include the thermal interface material layer 50 that extends laterally to be in contact with the top surfaces of the lower semiconductor chip 10 and the lower mold layer 12 and the side surfaces of the connection solder bumps 38. In example embodiments, the thermal interface material layer 50 may include portions filling the connection holes 14.

Except for this difference, the package-on-package devices 202 and 203 and their fabricating methods may be configured to have substantially the same or similar features as those of the example embodiments of the inventive concept.

Embodiment 4

Figure 15:
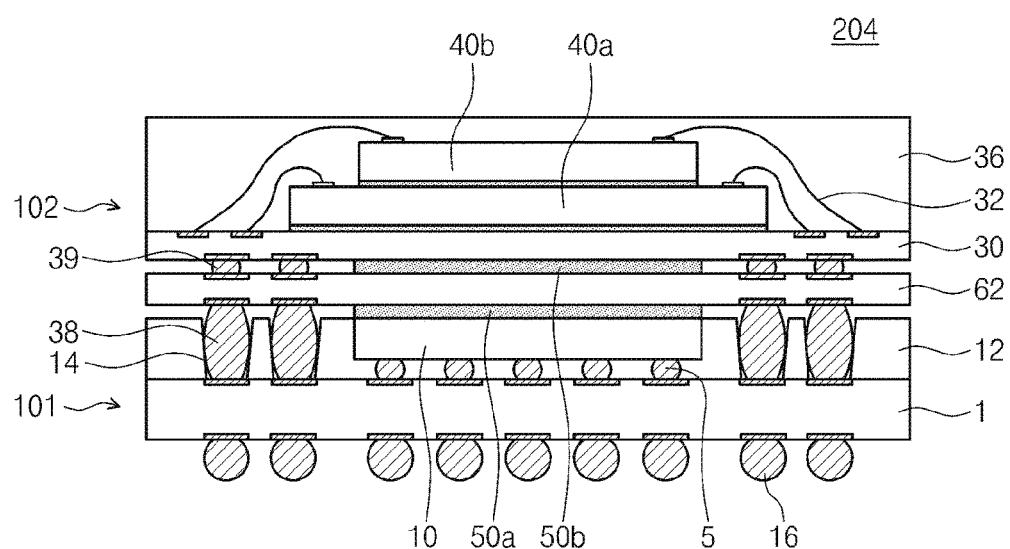
FIG. 15 is a sectional view illustrating an example of package-on-package devices according to example embodiment 4 of the inventive concept.

FIG. 15 is a sectional view illustrating an example of package-on-package devices according to embodiment 4 of the inventive concept.

Referring to FIG. 15, according to the present embodiment, a package-on-package device 204 may further include an interposer substrate 62 interposed between the lower and upper semiconductor packages 101 and 102. The lower semiconductor package 101 may be electrically connected to the interposer substrate 62 through the first connection solder bumps 38, and the upper semiconductor package 102 may be electrically connected to the interposer substrate 62 through second connection solder bumps 39. The interposer substrate 62 may be a printed circuit board (PCB), which may be made of, for example, plastic, flexible film, or ceramics. A first thermal interface material layer 50a may be interposed between the interposer substrate 62 and the lower semiconductor package 101, and a second thermal interface material layer 50b may be interposed between the interposer substrate 62 and the upper semiconductor package 102. Each of the first and second thermal interface material layers 50a and 50b may be configured to have substantially the same or similar features as those of the thermal interface material layer 50 of the example embodiments of the inventive concept.

Except for this difference, the package-on-package device 204 and its fabricating method may be configured to have substantially the same or similar features as those of the example embodiments of the inventive concept.

Embodiment 5

Figure 16:
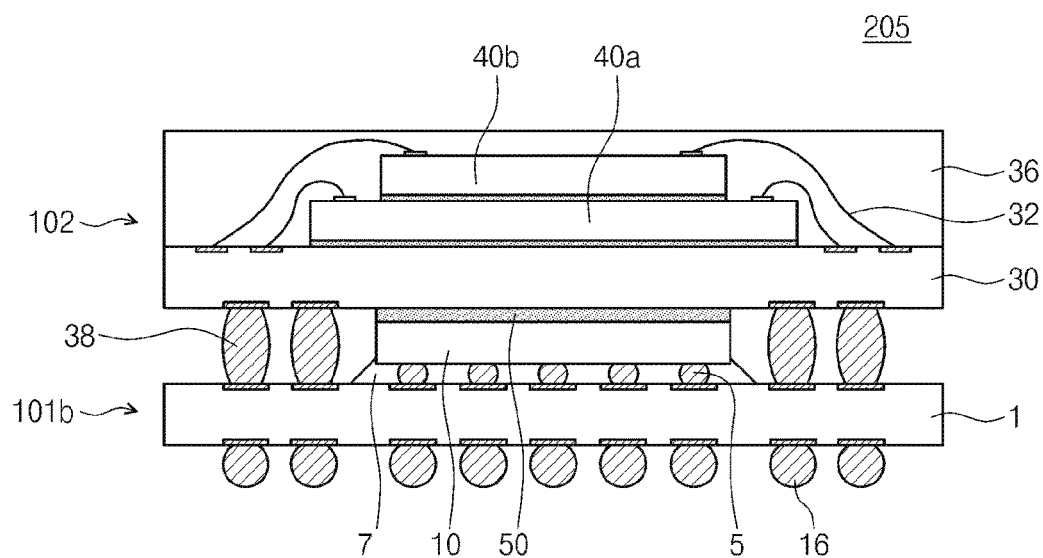
FIG. 16 is a sectional view illustrating an example of package-on-package devices according to example embodiment 5 of the inventive concept.

FIG. 16 is a sectional view illustrating an example of package-on-package devices according to embodiment 5 of the inventive concept.

Referring to FIG. 16, according to the present embodiment, a package-on-package device 205 may include a lower semiconductor package 101b, in which the lower mold layer 12 of FIG. 1 is not provided. In example embodiments, an under-fill resin layer 7 may be interposed between the lower semiconductor chip 10 and the lower package substrate 1. Except for this difference, the package-on-package device 205 and its fabricating method may be configured to have substantially the same or similar features as those of the example embodiments of the inventive concept.

Embodiment 6

Figure 17:
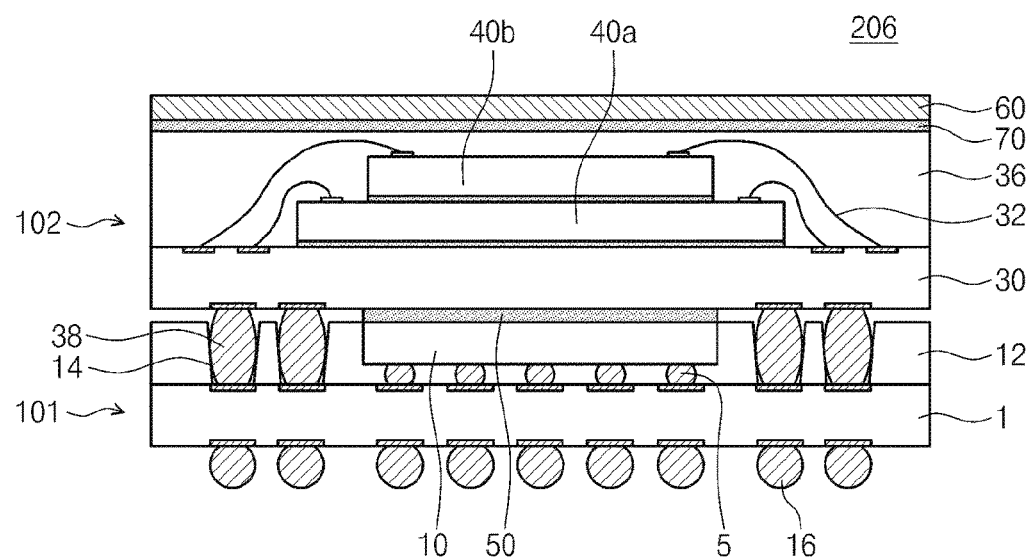
FIG. 17 is a sectional view illustrating an example of package-on-package devices according to example embodiment 6 of the inventive concept.

FIG. 17 is a sectional view illustrating an example of package-on-package devices according to embodiment 6 of the inventive concept.

Referring to FIG. 17, according to the present embodiment, a package-on-package device 206 may include the first thermal interface material layer 50 interposed between the upper and lower semiconductor packages 102 and 101. The first thermal interface material layer 50 may be configured to have substantially the same features as that of the example embodiments of the inventive concept. A second thermal interface material layer 70 and a heat-dissipating plate 60 may be sequentially disposed on the upper semiconductor package 102. The second thermal interface material layer 70 may be configured to have a different physical property from that of the first thermal interface material layer 50. The second thermal interface material layer 70 may be an adhesive layer. The heat-dissipating plate 60 may be a metal plate or a flexible metal tape. Except for this difference, the package-on-package device 206 and its fabricating method may be configured to have substantially the same or similar features as those of the example embodiments of the inventive concept.

Embodiment 7

Figure 18:
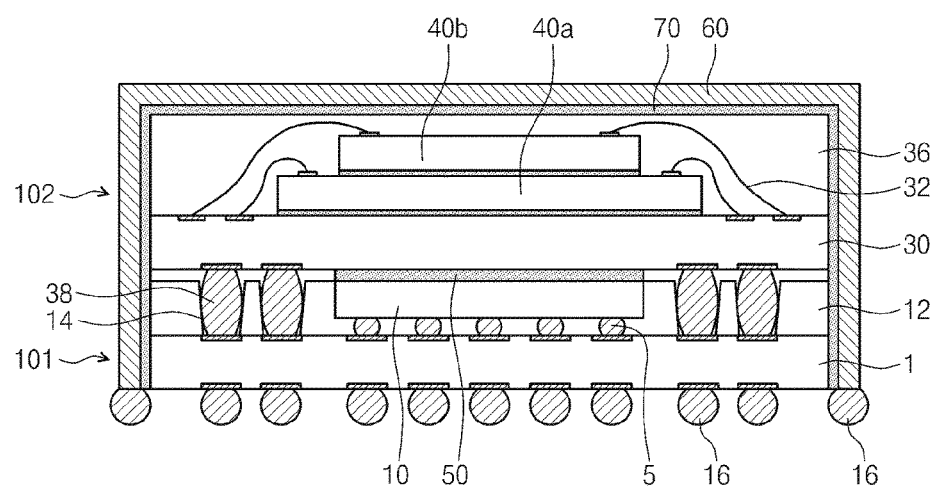
FIG. 18 is a sectional view illustrating an example of package-on-package devices according to example embodiment 7 of the inventive concept.

FIG. 18 is a sectional view illustrating an example of package-on-package devices according to example embodiment 7 of the inventive concept.

Referring to FIG. 18, according to the present embodiment, a package-on-package device 207 may be configured in such a way that the second thermal interface material layer 70 and the heat-dissipating plate 60 described in the further example embodiments are extended to cover side surfaces of the upper and lower semiconductor packages 102 and 101. The second lower solder bump 16 may be attached on a bottom surface of the heat-dissipating plate 60. This makes it possible to improve further the heat-exhausting efficiency of the device. According to the present embodiment, since the heat-dissipating plate 60 is provided to cover the top and side surfaces of the upper and lower semiconductor packages 102 and 101, the heat-dissipating plate 60 may also provide an electromagnetic interference (EMI) shielding function in addition to the heat-dissipation function. As a result, it is possible to suppress the semiconductor packages from malfunctioning.

Except for this difference, the package-on-package device 207 and its fabricating method may be configured to have substantially the same or similar features as those of the further example embodiments of the inventive concept.

The semiconductor package technology described above may be applied to realize a variety of semiconductor devices and package modules including the same.

Figure 19:
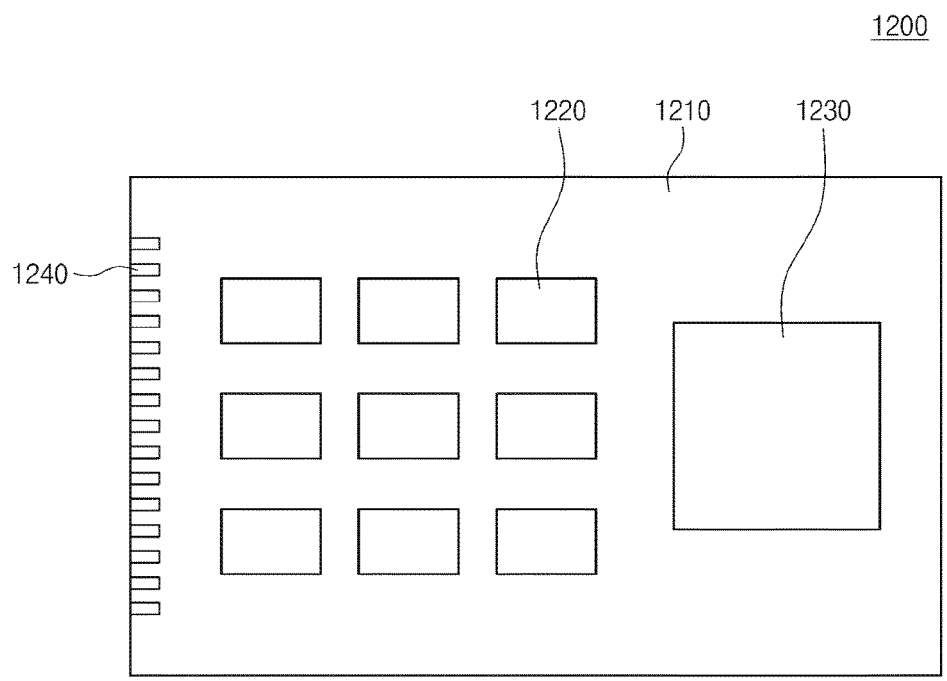
FIG. 19 is a diagram illustrating an example of package modules including semiconductor packages according to example embodiments of the inventive concept.

FIG. 19 is a diagram illustrating an example of package modules including semiconductor packages according to example embodiments of the inventive concept. Referring to FIG. 19, a package module 1200 may include semiconductor devices 1220 and a semiconductor device 1230 packaged in a quad flat package (QFP) type. The semiconductor devices 1220 and 1230 may be formed using a semiconductor package technology according to example embodiments of the inventive concept, and in the package module 1200, the semiconductor devices 1220 and 1230 may be mounted on a package substrate 1210. The package module 1200 may be connected to an external electronic device through an external connection terminal 1240 disposed at one side of the package substrate 1210.

Figure 20:
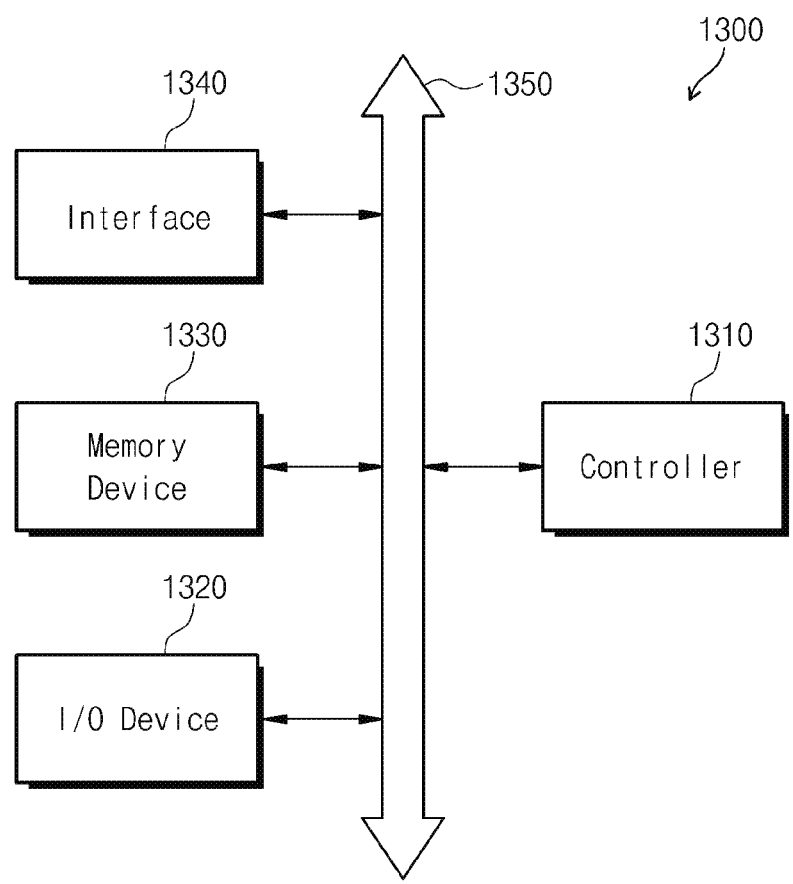
FIG. 20 is a schematic block diagram illustrating an example of electronic systems including semiconductor packages according to example embodiments of the inventive concept.

The semiconductor package technology may be applied to realize electronic systems. FIG. 20 is a schematic block diagram illustrating an example of electronic systems including semiconductor packages according to example embodiments of the inventive concept. Referring to FIG. 20, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include the semiconductor package according to example embodiments of the inventive concept. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 21:
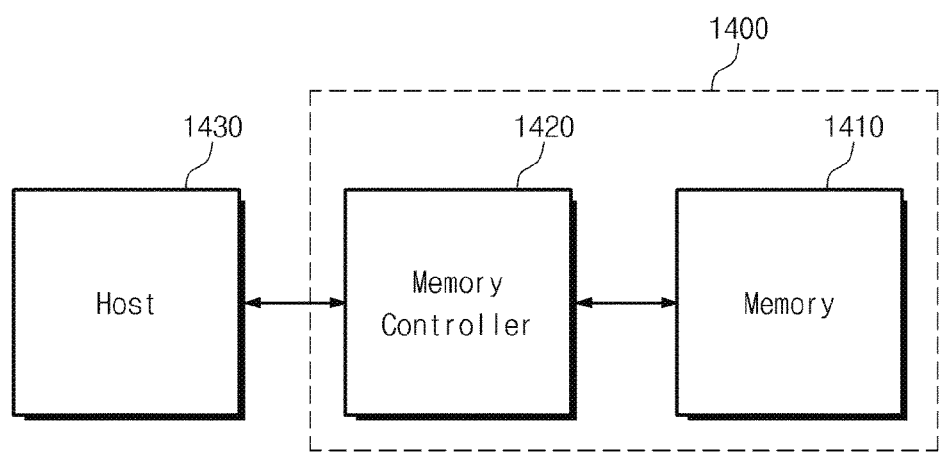
FIG. 21 is a schematic block diagram illustrating an example of memory systems including semiconductor packages according to example embodiments of the inventive concept.

The semiconductor device according to example embodiments of the inventive concept may be provided in a form of a memory card. FIG. 21 is a schematic block diagram illustrating an example of memory systems including semiconductor packages according to example embodiments of the inventive concept. Referring to FIG. 21, a memory system 1400 may include a non-volatile memory device 1410 and a memory controller 1420. The non-volatile memory device 1410 and the memory controller 1420 may store data or read stored data. The non-volatile memory device 1410 may include at least one non-volatile memory device, to which the semiconductor package technology according to example embodiments of the inventive concept is applied. The memory controller 1420 may control the non-volatile memory device 1410 in order to read the stored data and/or to store data in response to read/write request of a host 1430.

According to example embodiments of the inventive concept, a thermal interface material layer may be interposed between lower and upper semiconductor packages of a package-on-package device and be configured to have a specific physical property (for example, Mohs hardness that is lower than 7 and/or modulus of elasticity of 500 kPa or less). Accordingly, it is possible to prevent a crack from occurring in a lower semiconductor chip, when a solder ball joint process is performed to mount the upper semiconductor package on the lower semiconductor package. As a result, it is possible to reduce a failure of the package-on-package device and to improve a yield of the package-on-package device.

In addition, since the thermal interface material layer is added between the lower and upper semiconductor packages, it is possible to exhaust heat generated in the lower semiconductor chip quickly to the upper semiconductor package. As a result, it is possible to reduce a malfunction of the package-on-package device and to increase an operation speed of the package-on-package device.

While example embodiments of the inventive concept have been particularly shown and described, it will be understood by one of ordinary skill in the art that variations in form and detail may be made therein without departing from the spirit and scope of the attached claims.

The invention claimed is:

1. A semiconductor package device having a package-on-package (PoP) structure, the semiconductor package device comprising:
 a lower semiconductor package including a lower package substrate and a lower semiconductor chip mounted on the lower package substrate;
 an upper semiconductor package including an upper package substrate and a first upper semiconductor chip on the upper package substrate;
 a connection solder bump between the upper package substrate and the lower package substrate, the connection solder bump electrically connecting the upper semiconductor package and the lower semiconductor package;
 a thermal conductive material between the lower semiconductor package and the upper semiconductor package, the thermal conductive material including a resin layer and filler particles distributed in the resin layer, the filler particles include a plurality of filler particles including at least two layers; and
 a lower mold layer covering a sidewall of the lower semiconductor chip, and not covering a top surface of the lower semiconductor chip.

2. The semiconductor package device of claim 1, wherein the plurality of filler particles including at least two layers include a metal particle coated with an insulating layer, and the metal particle has a hardness lower than seven.

3. The semiconductor package device of claim 1, wherein the thermal conductive material includes a thermal interface material layer.

4. The semiconductor package device of claim 3, wherein the thermal interface material layer has a modulus of elasticity of 500 kPa or less, and the resin layer has a modulus of elasticity of 500 kPA or less.

5. The semiconductor package device of claim 1, wherein the thermal conductive material is in contact with the top surface of the lower semiconductor chip and a lower surface of the upper package substrate.

6. The semiconductor package device of claim 5, wherein the lower semiconductor chip is electrically connected to the lower package substrate through flip-chip bonding.

7. The semiconductor package device of claim 6, wherein the connection solder bump is adjacent to the lower semiconductor chip and a side surface of the connection solder bump is covered by the thermal conductive material.

8. The semiconductor package device of claim 7, wherein the side surface of the thermal conductive material is coplanar with the side surface of the lower mold layer.

9. The semiconductor package device of claim 8, wherein the first upper semiconductor chip is electrically connected to the upper package substrate through wire bonding.

10. The semiconductor package device of claim 9, wherein a size of the first upper semiconductor chip is larger than a size of the lower semiconductor chip.

11. The semiconductor package device of claim 9, wherein a first area covered by the first upper semiconductor chip is greater than a second area covered by the lower semiconductor chip.

12. The semiconductor package device of claim 10, wherein the upper semiconductor package further includes a second upper semiconductor chip stacked on the first upper semiconductor chip.

13. The semiconductor package device of claim 12, wherein the second upper semiconductor chip is electrically connected to the upper package substrate through wire bonding.

14. The semiconductor package device of claim 12, wherein the first upper semiconductor chip and the second upper semiconductor chip are covered with an upper mold layer.

15. The semiconductor package device of claim 1, wherein the filler particles include at least one of boron nitride particles and zinc oxide particles.

16. The semiconductor package device of claim 2, wherein the plurality of filler particles including at least two layers include an aluminum particle coated with an insulating layer selected from zinc oxide (ZnO), aluminum oxide ($Al_2O_3$), and silicon oxide ($SiO_2$).

17. The semiconductor package device of claim 1, wherein the resin layer includes a silicon-based compound or a rubber-based compound.

18. The semiconductor package device of claim 1, wherein the thermal conductive material has a hardness lower than seven.

19. The semiconductor package device of claim 1, wherein the thermal conductive material has a thermal conductivity of 1 W/mK or higher.

20. A method of fabricating a package-on-package (PoP) device, the method comprising:
 preparing a lower semiconductor package including a lower package substrate and a lower semiconductor chip on the lower package substrate;
 preparing an upper semiconductor package including an upper package substrate, a first upper semiconductor chip on the upper package substrate and an upper connection solder bump attached to a lower surface of the upper package substrate;
 performing a molding process to form a lower mold layer covering the lower semiconductor chip;
 performing a polishing process on the lower mold layer, thereby exposing a top surface of the lower semiconductor chip;
 forming a connection hole adjacent to the lower semiconductor chip by removing a portion of the lower mold layer, thereby exposing a portion of the lower package substrate;
 forming a lower connection solder bump on the exposed portion of the lower package substrate by the connection holes;
 coating the top surface of the lower semiconductor chip with a thermal conductive material, the thermal conductive material contacting the top surface of the lower semiconductor chip and a side of the lower connection solder bump;
 stacking the upper semiconductor package on the lower semiconductor package for the upper connection solder bump to be inserted into the connection hole, and thereby contacting the lower connection solder bump; and
 applying heat to the upper connection solder bump and the lower connection solder bump to be melted to form a connection solder bump,
 wherein the lower mold layer covers a sidewall of the lower semiconductor chip, and does not cover the top surface of the lower semiconductor chip, and
 wherein the thermal conductive material including a resin layer and filler particles distributed in the resin layer, the filler particles include a plurality of filler particles including at least two layers.

* * * * *